(12) United States Patent
Kim et al.

(10) Patent No.: US 6,333,129 B2
(45) Date of Patent: *Dec. 25, 2001

(54) METHOD OF FABRICATING PHASE SHIFT MASK

(75) Inventors: Yong-hoon Kim, Kyungki-do; Jin-hong Park, Seoul, both of (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,352

(22) Filed: Apr. 21, 1999

(30) Foreign Application Priority Data

Jul. 23, 1998 (KR) .................................. 98-29738

(51) Int. Cl.$^7$ ........................................................ G03F 9/00
(52) U.S. Cl. .............................. 430/5; 430/322; 430/323; 430/324
(58) Field of Search ............................... 430/5, 322, 323, 430/324; 216/44, 47

(56) References Cited

U.S. PATENT DOCUMENTS

| | | | |
|---|---|---|---|
| 5,300,379 | * | 4/1994 | Dao et al. ................................. 430/5 |
| 5,332,470 | * | 7/1994 | Crotti ....................................... 216/2 |
| 5,589,303 | * | 12/1996 | DeMarco et al. ........................ 430/5 |
| 5,932,378 | * | 8/1999 | Lee ........................................... 430/5 |

OTHER PUBLICATIONS

W. Loong et al. "Simulation and Fabrication of a New Phase Shifting Mask for 0.35 $\mu$m Contact Hole Pattern Transfer"; SPIE vol. 2087 Photomask Technology and Management (1993); pp. 380–389.

* cited by examiner

Primary Examiner—Mark F. Huff
Assistant Examiner—Saleha R. Mohamedulla
(74) Attorney, Agent, or Firm—Volentine Francos, PLLC

(57) ABSTRACT

A method of fabricating a phase shift mask is provided in which light shield film patterns for setting a phase shift region and a phase non-shift region are simultaneously formed on a substrate. A groove is formed in the substrate set as the phase shift region. The light shield film pattern, which contacts the groove and is formed on a region of the substrate set as the phase non-shift region, is removed. A phase shift layer can be formed between the substrate and the light shield film pattern. In this case, regions set by the light shield film pattern become opposite to when the phase shift layer is not formed. That is, a phase shift region is changed into a phase non-shift region, and the phase non-shift region is changed into the phase shift region. As described above, the phase shift region and the phase non-shift region are simultaneously set when the light shield film pattern is formed, thus preventing the position of the phase shift or non-shift region from being shifted due to sequential formation of the phase shift and non-shift regions.

10 Claims, 7 Drawing Sheets

METHOD OF FABRICATING PHASE SHIFT MASK

CROSS-REFERENCES TO RELATED APPLICATIONS

The present application claims priority under 35 U.S.C. §119 to Korean Patent Application No. 98-29738 filed on Jul. 23, 1998, the entire contents of which are hereby incorporated by reference for all purposes.

BACKGROUND OF THE INVENTION

1. Field of the Invention

The present invention relates to a method of fabricating semiconductor devices, and more particularly, to a method of fabricating a phase shift mask.

2. Description of the Related Art

A general blank mask is formed by forming a chrome layer as a transmission preventing film on a quartz substrate and coating a photosensitive film on the resultant structure. A phase shift mask (PSM) is effective in improving resolution and the depth of focus in a process for forming a contact hole.

A halftone PSM generates a sidelobe effect. Accordingly, a photosensitive film in an undesired region is damaged. Thus, if such a problem is not solved, the application field of the halftone PSM becomes narrow.

The sidelobe effect becomes more severe as a pitch between devices becomes narrower due to increasing integration of semiconductor devices. To solve this problem, a halftone rim PSM also uses a rim-type structure used by a quartz PSM.

A conventional rim-type PSM and a fabrication method thereof will now be described in brief referring to the attached drawings.

Referring to FIG. 1, in the conventional rim-type PSM, a plurality of grooves 12, which will become phase shift regions, are formed at regular intervals in a quartz substrate 10. Light shield film patterns 14 are formed on the quartz substrate 10 between the grooves 12, and a rim region 14a is formed between the light shield pattern 14 and the groove 12.

Referring to FIG. 2, in a conventional rim-type halftone PSM, phase shift layer patterns 16 are formed on a quartz substrate 10, between phase non-shift regions 17. Light shield film patterns 18 are formed on the phase shift layer patterns 16. A rim region 18a is formed between the light shield film pattern 18 and the phase shift layer pattern 16.

A method of fabricating the conventional rim PSM shown in FIG. 1 will now be described.

Referring to FIG. 3, a light shield film (not shown) is formed on the quartz substrate 10. A photosensitive film pattern 22 for exposing a predetermined region of the light shield film is formed on the light shield film. An exposed portion of the light shield film is removed using the photosensitive pattern as a mask, thereby forming a light shield film pattern 20 for exposing a predetermined region of the substrate in which phase shifting occurs. Then, the photosensitive film pattern 22 is removed. Consequently, as shown in FIG. 4, a groove 24 is formed to a depth which can provoke phase shifting, in the exposed region of the quartz substrate 10.

A photosensitive film pattern 26 which exposes a portion of the light shield film pattern 20 adjacent to the groove 24 is formed on the light shield film pattern 20, in FIG. 5. The exposed portion of the light shield film pattern 20 is removed using the photosensitive film pattern 26 as an etch mask. The photosensitive film pattern 26 is removed. Consequently, a phase non-shift region 24a is set on the quartz substrate 10 at the circumference of the groove 24, in FIG. 6.

A method of fabricating the conventional rim-type halftone PSM shown in FIG. 2 will now be described.

As shown in FIG. 7, in the rim halftone PSM, as opposed to the general rim PSM, a phase shift layer 28 is additionally formed between a quartz substrate 10 and a light shield film 20. The light shield film 20 and the phase shift layer 28 are anisotropically etched using a photosensitive film pattern 30, which is formed on the light shield film 20 and exposes part of the light shield film 20, as an etch mask. Then, the photosensitive film pattern 30 is removed. As a result, as shown in FIG. 8, a predetermined region 32 of the quartz substrate 10 is exposed. This region is a phase non-shift region.

Referring to FIG. 9, a photosensitive film pattern 34 which exposes a portion of the light shield film 20 adjacent to the exposed region 32 on the quartz substrate 10 is formed on the light shield film 20. The exposed portion of the light shield film 20 is removed using the photosensitive film pattern 34 as an etch mask, thereby exposing the phase shift layer 28 below the exposed portion of the light shield film 20. An exposed region 36 of the phase shift layer 28 is a phase shift region. The photosensitive film pattern 34 is removed, thereby forming the halftone PSM comprised of the predetermined exposed region 32 on the quartz substrate 20 and the predetermined exposed region 36 on the phase shift layer 28 at the circumference of the exposed region 32, as shown in FIG. 10.

In the method of fabricating the conventional rim PSM or rim halftone PSM as described above, the position of a rim region is shifted, in association with a method of forming a light shield film pattern and a main pattern comprised of a phase shift region and a phase non-shift region and setting (forming) a rim region (or a rim pattern). Such a problem occurs because registration, orthogonality, and grid of exposure equipment are not completely consistent with each other. Also, accuracy of the size and position of the rim pattern to be formed between the main patterns of the PSM becomes more important with an increase in the integration of a semiconductor device.

SUMMARY OF THE INVENTION

The present invention is therefore directed to a method of fabricating phase shift masks which substantially overcomes one or more of the problems due to the limitations and disadvantages of the related art.

An object of the present invention is to provide a method of fabricating a phase shift mask, by which deformation of a main pattern due to the shift of a rim can be prevented by setting (forming) a rim region (or pattern) at an accurate position upon manufacturing a rim phase shift mask.

The above and other objects, may be achieved by a method of fabricating a phase shift mask according to an embodiment of the present invention. In this method, a light shield film is formed on a substrate. First and second regions of the substrate are exposed by patterning the light shield film. A groove is formed in the first region of the substrate. A light shield film pattern formed on the substrate between the groove and the second region is removed.

Here, the formation of the groove may include: coating a first photosensitive film on the entire surface of the resultant structure on which the first and second regions of the substrate are exposed; forming a first photosensitive film pattern exposing the entire first region and a part of the light shield film pattern in contact with the first region, by patterning the first photosensitive film; forming a groove in the first region of the substrate by using the first photosensitive film pattern as an etch mask; and removing the first photosensitive film pattern.

The removal of the light shield film pattern may include: coating a second photosensitive film on the entire surface of the resultant structure on which the first photosensitive film pattern has been removed; forming a second photosensitive film pattern exposing the entire first region of the substrate, the entire light shield film pattern formed on the substrate between the first and second regions, and a part of the second region of the substrate, by patterning the second photosensitive film; etching out the light shield film pattern formed on the substrate between the first and second regions, using the second photosensitive film pattern as an etch mask; and removing the second photosensitive film pattern.

To achieve the above and other objects, there is also provided a method of fabricating a phase shift mask according to another embodiment of the present invention. In this method, a phase shift layer and a light shield film are sequentially formed on a substrate. First and second regions of the phase shift layer are exposed by patterning the light shield film. The substrate is exposed by removing the phase shift layer exposed to the first region. The light shield film formed on the phase shift layer between the exposed substrate and the second region is removed.

The exposing of the substrate may include: coating a photosensitive film on the entire surface of the resultant structure on which the light shield film is patterned, and patterning the photosensitive film such that the photosensitive film pattern exposes the entire first region and a part of the light shield film pattern adjacent to the first region. The phase shift layer in the first region is etched out using the photosensitive film pattern as an etch mask. The photosensitive film pattern is then removed.

The removing of the light shield film may include coating another photosensitive film on the entire surface of the resultant structure where the substrate is exposed by removing the first region of the phase shift layer. The other photosensitive film pattern is formed by patterning the fourth photosensitive film. Here, the other photosensitive film pattern exposes the entire surface of an exposed portion of the substrate, the entire light shield film pattern which is formed on the phase shift layer between the second regions and contacts the exposed portion of the substrate, and a part of the phase shift layer in the second region. The light shield film pattern formed on the phase shift layer between the second region and the exposed portion of the substrate, is wet-etched using the other photosensitive film pattern as an etch mask. The other photosensitive film pattern is then removed.

Preferably, the first region is wider than the second region.

As described above, when the rim phase shift mask is manufactured, the phase shift region and the phase non-shift region of the mask are simultaneously formed, thus preventing the phase shift or non-shift region from being shifted relative to one another.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objective and advantage of the present invention will become more apparent by describing in detail preferred embodiments thereof with reference to the attached drawings in which.

DESCRIPTION OF THE PREFERRED EMBODIMENTS

Figure 1:
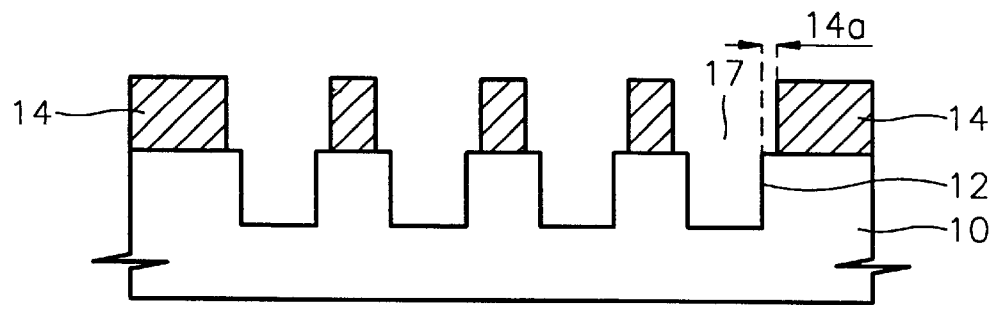
FIGS. 1 and 2 are cross-sectional views of a conventional rim phase shift mask and a conventional halftone rim phase shift mask, respectively.
Figure 2:
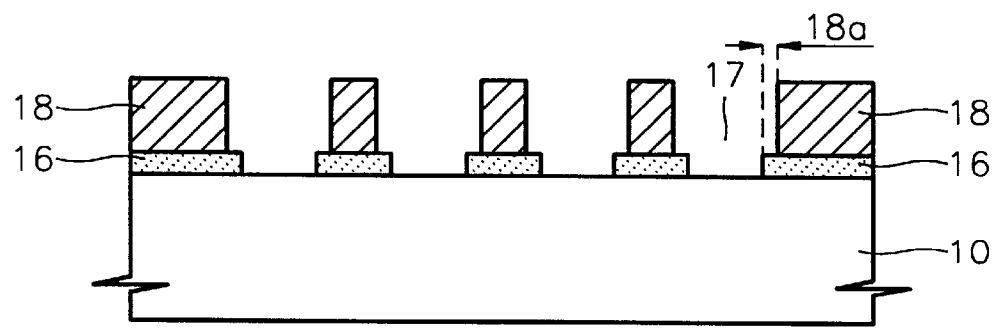
Figure 3:
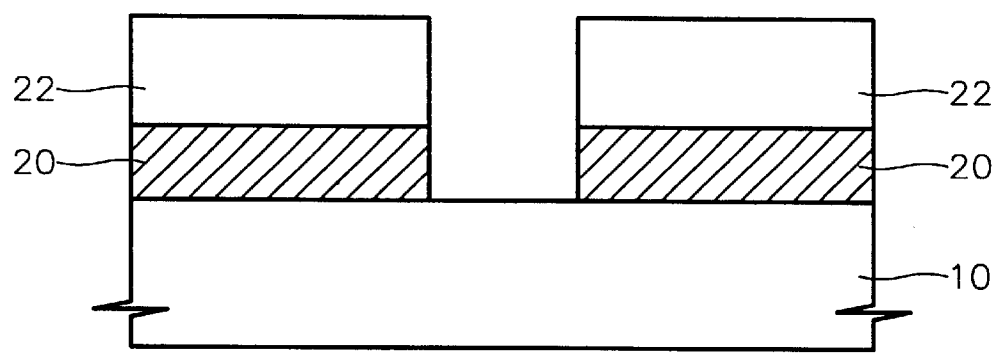
FIGS. 3 through 6 are cross-sectional views illustrating a method of fabricating the conventional rim phase shift mask.
Figure 4:
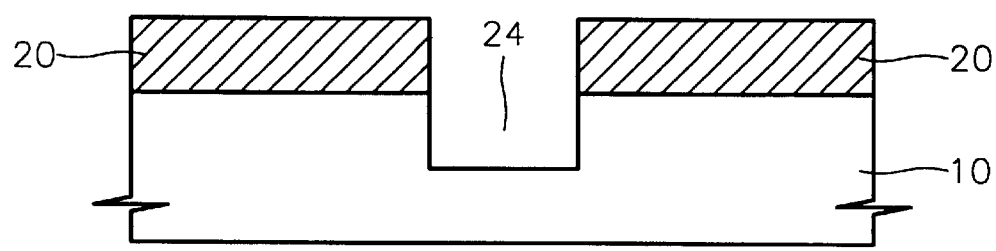
Figure 5:
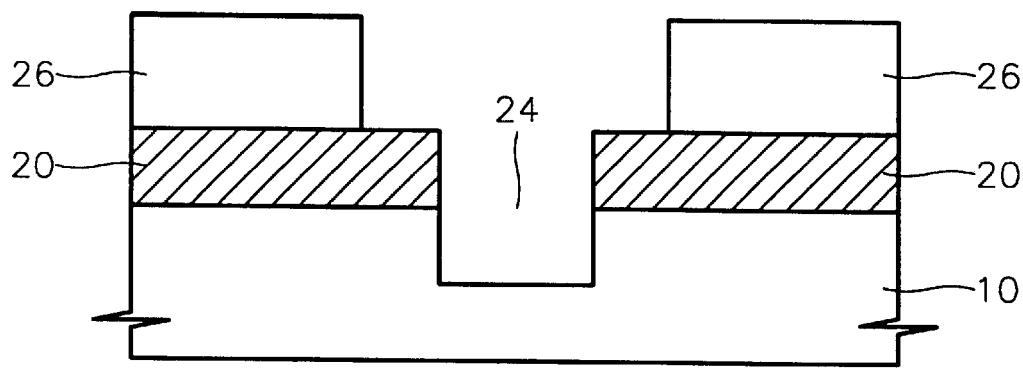
Figure 6:
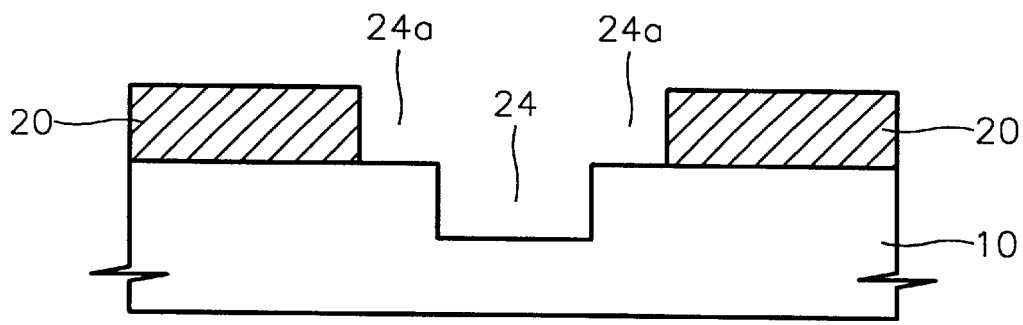
Figure 7:
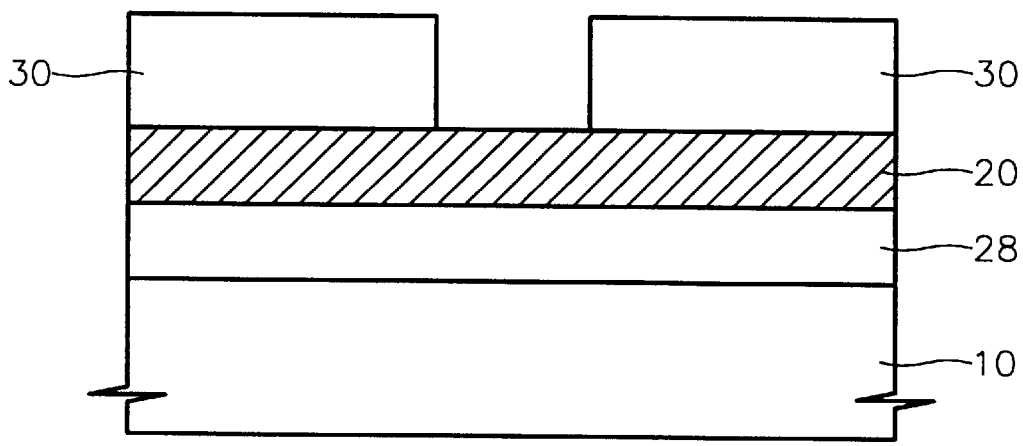
FIGS. 7 through 10 are cross-sectional views illustrating a method of fabricating the conventional halftone rim phase shift mask.
Figure 8:
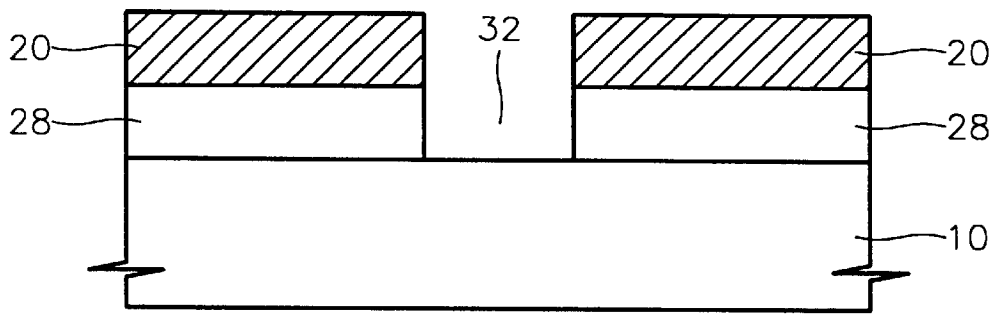
Figure 9:
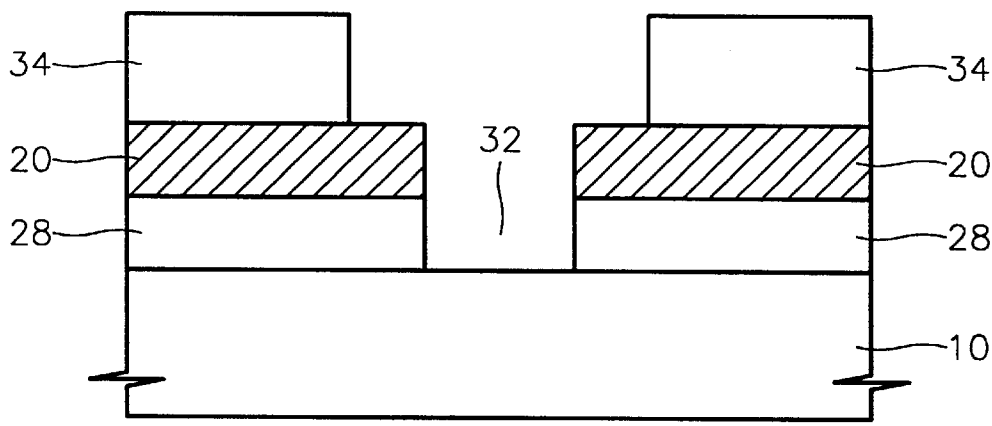
Figure 10:
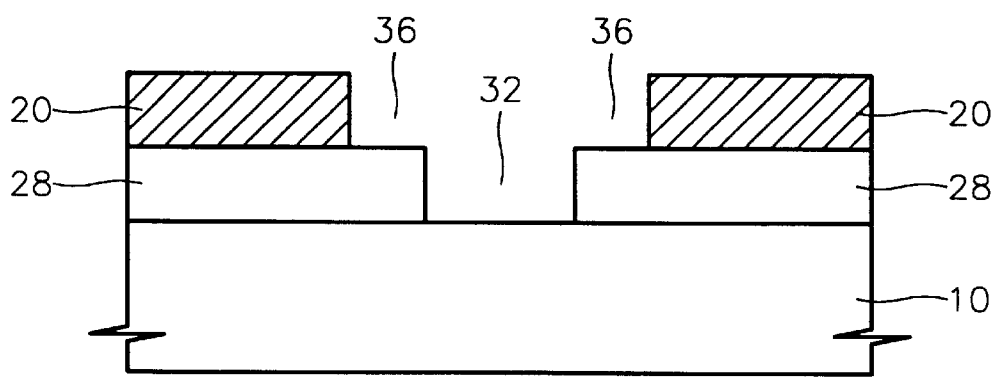

The present invention is not limited to the following embodiments but may be implemented in various ways. The scope of the present invention must not be interpreted as being limited to embodiments to be described hereinafter. The embodiments of the present invention are provided to more completely explain the present invention to those skilled in the art. In drawings, the thicknesses of layers or regions are exaggerated for clarity. In the drawings, like reference numerals indicate the same elements. When it is stated that a layer exists "on" another layer or a substrate, the layer may exist directly on the other layer or the substrate or other layers may intervene between the layer and the other layer or substrate.

Figure 11:
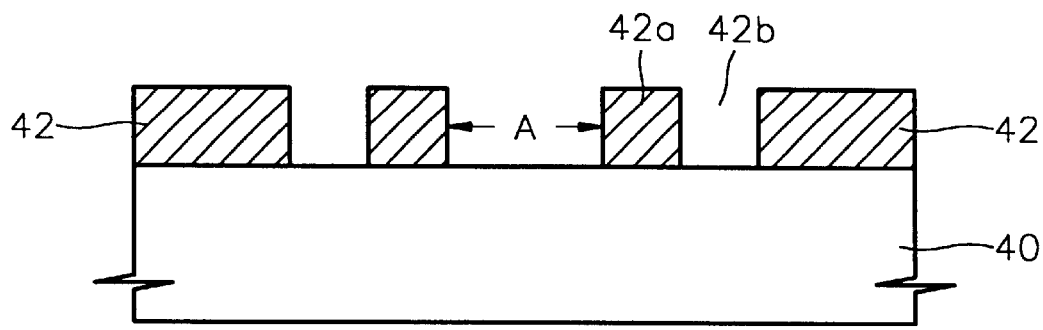
FIGS. 11 through 15 are cross-sectional views illustrating a method of fabricating a rim phase shift mask according to a first embodiment of the present invention.

FIG. 11 shows the step of setting first and second regions A and 42b, respectively. Referring to FIG. 11, a light shield film (not shown) is formed on a substrate 40. The light shield film is preferably formed of chromium (Cr). The light shield film is patterned to form first and second light shield film patterns 42 and 42a exposing the first and second regions A and 42b. The first region A is an inner region and the second regions 42a are outer regions. The second light shield film pattern 42a is a rim for setting the first region A of the substrate 40. The first region A is a phase shift region. The second light shield film pattern 42a and the second region 42b are set to be phase non-shift regions. It is preferable that the first region A is wider than the second region 42b.

Figure 12:
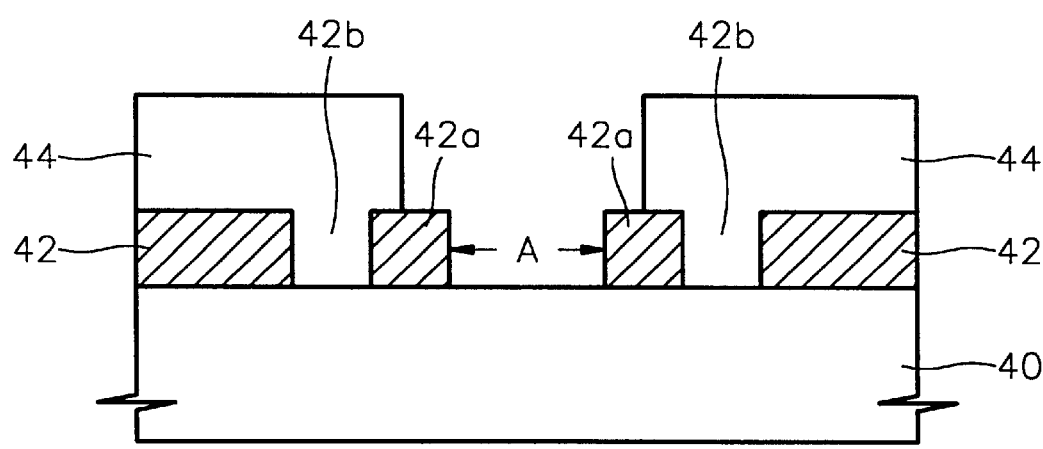

Referring to FIG. 12, a first photosensitive film (not seen) is coated on the entire surface of the resultant structure having the first and second light shield film patterns 42 and 42a. The first photosensitive film is patterned to form a first photosensitive film pattern 44 exposing the whole of the first region A and a part of the second light shield film pattern 42a.

Figure 13:
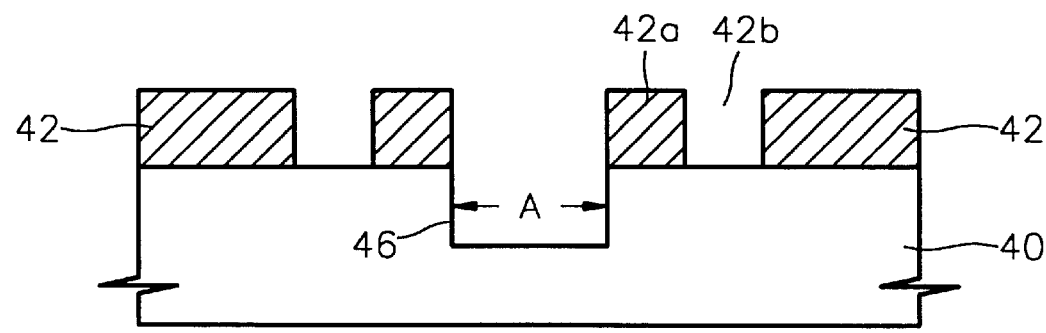

Referring to FIG. 13, a groove 46 is formed in the first region A of the substrate 40 using the first photosensitive film pattern 44 as an etch mask. It is preferable that the groove 46 is formed to a depth where a light incident upon the groove 46 and a light incident upon a region in which the groove 46 is not formed can be accurately phase-shifted to each other. The first photosensitive film pattern 44 is removed.

Figure 14:
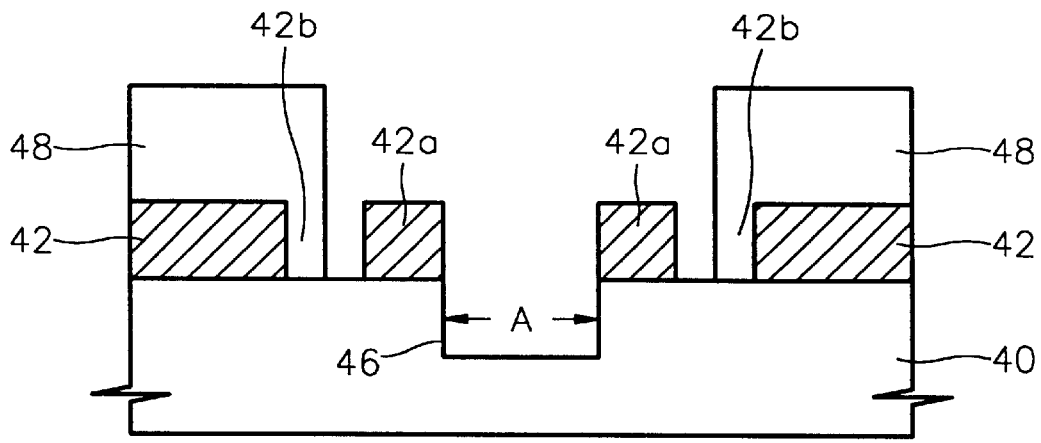
Figure 15:
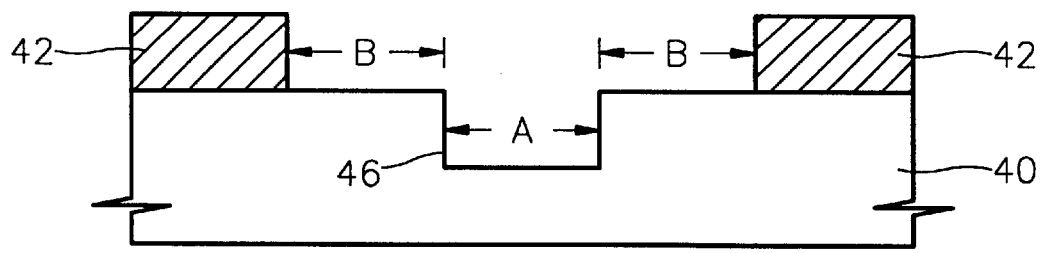

Referring to FIG. 14, a second photosensitive film (not seen) is formed on the entire surface of the resultant structure having the groove 46 formed therein. The second photosensitive film is patterned to form a second photosensitive film pattern 48 exposing the groove 46, the whole of the second light shield film pattern 42a, and a part of the second region 42b. The second light shield film pattern 42a is wet-etched out using the second photosensitive film pattern 48 as an etch mask. Then, the second photosensitive film pattern 48 is removed. Accordingly, as shown in FIG. 15, a region B on a portion of the substrate 40 contacting the groove 46 is exposed. As a result, the region B includes the second region 42b and the second light shield film pattern 42a. The region B is a phase non-shift region with respect to the first region A. Thus, light incident upon the phase non-shift region B is not phase-shifted after passing through the phase non-shift region B.

Hereinafter, a description will be given for a method of fabricating a rim halftone phase shift mask according to a second embodiment of the present invention.

If reference numerals to be mentioned in this description are the same as those in the first embodiment, elements of the reference numerals are the same as those in the first embodiment.

Figure 16:
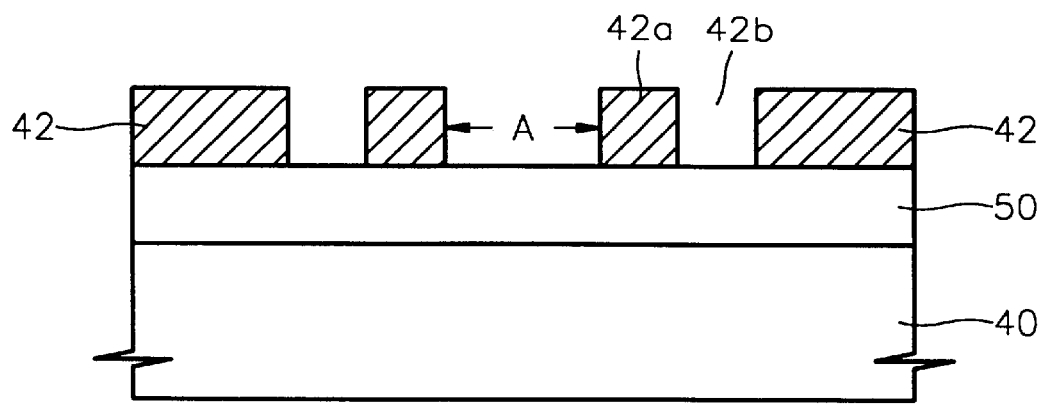
FIGS. 16 through 20 are cross-sectional views illustrating a method of fabricating a rim halftone phase shift mask according to a second embodiment of the present invention.

Referring to FIG. 16, a phase shift layer 50 and a light shield film (not shown) are sequentially formed on a substrate 40. The light shield film is patterned to form first and second light shield film patterns 42 and 42a which expose first and second regions A and 42b of the phase shift layer 50. The first region A is wider than the second region 42b. A region of the substrate 40 under the first region A is a phase nonshift region. Also, regions of the substrate 40 under the second region 42b and the second light shield film pattern 42a are phase shift regions. Thus, it is preferable that the phase shift layer 50 is formed to a thickness which can shift the phase of an incident light.

Figure 17:
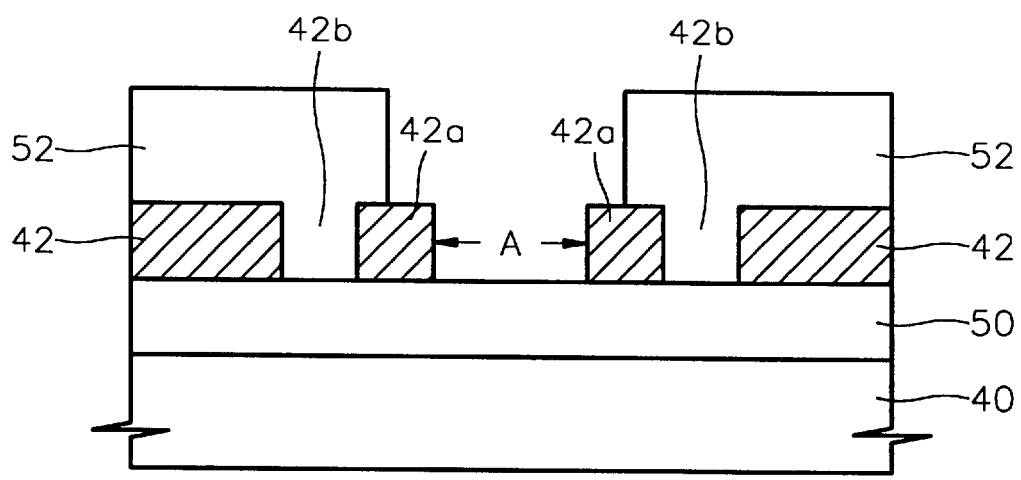

Referring to FIG. 17, a first photosensitive film (not seen) is formed on the entire surface of the phase shift layer 50 having the first and second light shield film patterns 42 and 42a formed thereon. The first photosensitive film is patterned to form a third photosensitive film pattern 52 which exposes the entire first region A of the phase shift layer 50 and a part of the second light shield film pattern 42a. Here, a margin with respect to an alignment error, which may be generated in an exposure process for forming the first photosensitive film pattern 52, corresponds to the width of the second light shield film pattern 42a. That is, in the exposure alignment, the width of the second light shield film pattern 42a is an allowable error of this exposure alignment.

Figure 18:
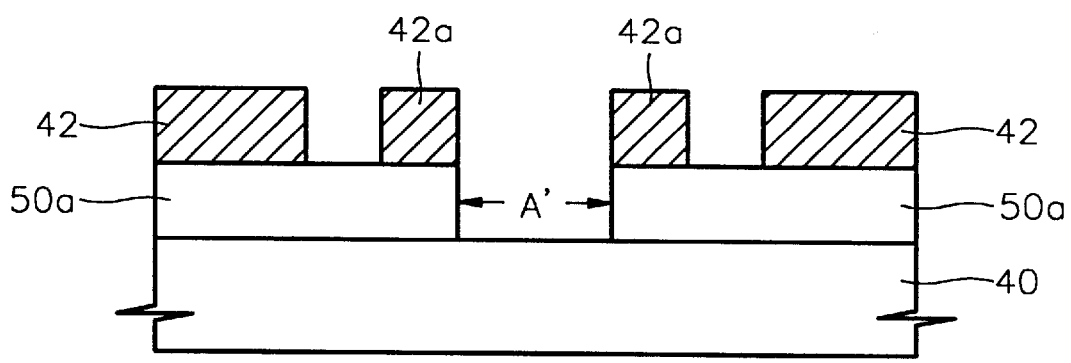

Thereafter, the entire exposed surface of the phase shift layer 50 is anisotropically etched until the interface of the substrate 40 is exposed, using the first photosensitive film pattern 52 as an etch mask. Then, the first photosensitive film pattern 52 is removed. Consequently, a region A' of the substrate 40 under the first region A of the phase shift layer 50 is exposed, thus forming a phase shift layer pattern 50a including this region A' as shown in FIG. 18. The region A' of the substrate 40 is a phase non-shift region where the phase of an incident light is not shifted.

Figure 19:
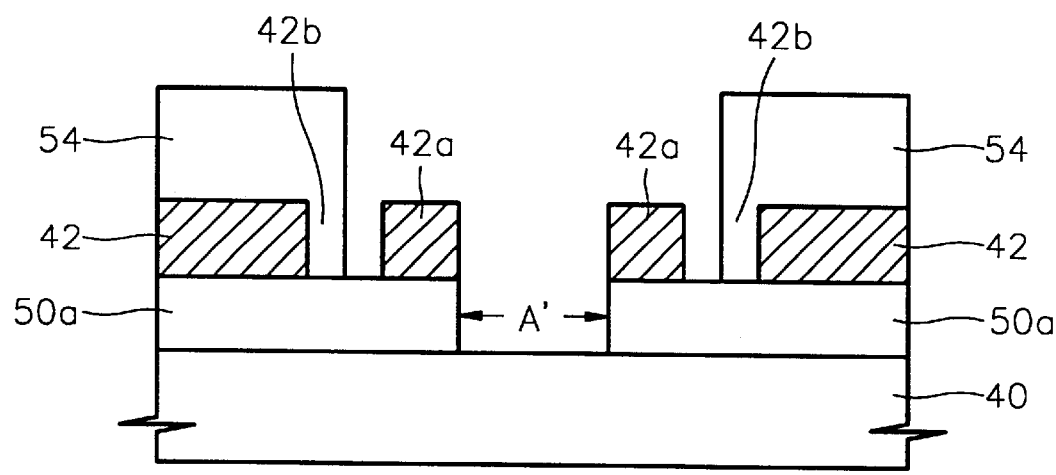
Figure 20:
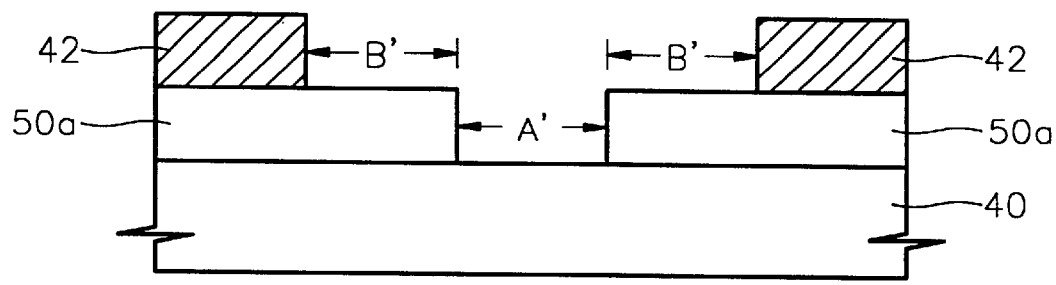

Referring to FIG. 19, a second photosensitive film (not seen) is coated on the entire surface of the resultant structure having the phase non-shift region A' and the phase shift layer pattern 50a formed thereon. The second photosensitive film is patterned to form a fourth photosensitive film pattern 54 exposing the entire surface of the region A', the whole of the second light shield film pattern 42a contacting the phase non-shift region A', and a part of the second region 42b. Here, the width of the second region 42b corresponds to a margin with respect to the alignment error in the exposure process for forming the second photosensitive film pattern 54. The second light shield film pattern 42a is wet etched using the second photosensitive film pattern 54 as an etch mask. The second photosensitive film pattern 54 is removed. Thus, a phase shift region B' whose edge is in contact with the phase non-shift region A' is formed in the phase shift layer pattern 50a, as shown in FIG. 20. The phase shift region B' is a sum of the second region 42b and a region where the second light shield film pattern 42a has been formed. Light incident upon phase shift region B' is shifted relative to light incident upon the phase non-shift region A'. In this way, the rim phase shift mask and the rim halftone phase shift mask are completed.

Many items are indicated in detail on the above description, but they do not limit the scope of the present invention and must be interpreted as an example of a preferred embodiment. For example, it is apparent that those skilled in the art to which the present invention pertains can realize the present invention by changing the component materials of the above elements, the configuration of the layers formed on a substrate, and the number of rims. Accordingly, the scope of the present invention must be determined not by the abovedescribed embodiments but by the technical spirit of the attached claims.

As described above, light shield film patterns for setting a phase shift region and a phase non-shift region are simultaneously formed on a substrate. A groove is formed in the substrate which is set as the phase shift region. The light shield film pattern formed on a region, which is set as the phase non-shift region of the substrate and contacts the groove, is removed. There is an embodiment in which a phase shift layer is formed between the substrate and the light shield film pattern. Here, a region set by the light shield film pattern is opposite to when the phase shift layer is not formed. That is, a phase shift region is changed into a phase non-shift region, and the phase non-shift region is changed into the phase shift region.

The phase shift region and the phase non-shift region are simultaneously set when the light shield film pattern is formed, thus preventing the position of the phase shift or non-shift region from being shifted due to formation of the phase shift and non-shift regions in sequential steps.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

What is claimed is:

1. A method of fabricating a phase shift mask, comprising:

forming a light shield film on a substrate;

patterning the light shield film to expose first and second regions of the substrate, the first region of the substrate corresponding to a phase shift region and the second region of the substrate corresponding to a part of a phase non-shift region, the patterned light shield film remaining on a further part of the phase non-shift region between the first and second regions of the substrate;

forming a groove in the first region of the substrate; and removing the patterned light shield film existing on the substrate between the first and second regions of the substrate.

2. The method of fabricating a phase shift mask as claimed in claim 1, wherein the forming of a groove comprises:

coating a photosensitive film on an entire surface of the patterned light shield film and on the first and second regions of the substrate;

forming a photosensitive film pattern exposing only the first region of the substrate and portions of the patterned light shield film in immediate contact with the first region of the substrate, by patterning the photosensitive film;

forming a groove in the substrate at the first region of the substrate, by using the photosensitive film pattern as an etch mask; and removing the photosensitive film pattern.

3. The method of fabricating a phase shift mask as claimed in claim 1, wherein the removing of the patterned light shield film comprises:

coating a photosensitive film on an entire surface of the patterned light shield film, in the groove and in the second region of the substrate; p1 forming a photosensitive film pattern exposing only the groove, the patterned light shield film formed on the substrate between the groove and the second region of the substrate, and a portion of the second region of the substrate, by patterning the photosensitive film;

etching out the patterned light shield film formed on the substrate between the groove and the second region of the substrate, using the photosensitive film pattern as an etch mask; and removing the photosensitive film pattern.

4. The method of fabricating a phase shift mask as claimed in claim 1, wherein the first region of the substrate is wider than the second region of the substrate.

5. A method of fabricating a phase shift mask, comprising:

sequentially forming a phase shift layer and a light shield film on a substrate;

forming a first window and second windows in the light shield film to respectively expose a first region and second regions of the phase shift layer, by patterning the light shield film;

exposing the substrate only in the first window by removing the first region of the phase shift layer; and removing all of the light shield film pattern formed on the phase shift layer only between the exposed substrate and the second windows.

6. The method of fabricating a phase shift mask as claimed in claim 5, wherein the exposing of the substrate comprises:

coating a photosensitive film on an entire surface of the light shield film pattern and in the first and second windows;

forming a photosensitive film pattern exposing the first window and portions of the light shield film pattern immediately adjacent to the first window, by patterning the photosensitive film;

etching out the first region of the phase shift layer in the first window using the photosensitive film pattern as an etch mask to expose the substrate; and removing the photosensitive film pattern.

7. The method of fabricating a phase shift mask as claimed in claim 5, wherein the first window is wider than the second windows.

8. The method of fabricating a phase shift mask as claimed in claim 5, wherein the exposed substrate is a phase non-shift region, and regions between the exposed substrate and the second regions are phase shift regions.

9. The method of fabricating a phase shift mask as claimed in claim 5, wherein the removing the light shield film comprises:

coating a photosensitive film on an entire surface of the light shield film pattern, on the exposed substrate, and in the second windows;

forming a photosensitive film pattern exposing only the exposed substrate, the light shield film pattern which is formed on the phase shift layer between the second windows and the exposed substrate, and portions of the second windows, by patterning the photosensitive film;

wet-etching the light shield film pattern formed on the phase shift layer between the second windows and the exposed substrate, by using the photosensitive film pattern as an etch mask; and removing the photosensitive film pattern.

10. The method of fabricating a phase shift mask as claimed in claim 5, wherein the first window and the second windows of the light shield film pattern respectively comprise an inner window and outer windows.

* * * * *